(12) United States Patent
Song et al.

(10) Patent No.: US 11,835,579 B2
(45) Date of Patent: Dec. 5, 2023

(54) MEMORY DEVICE DETECTING DEFECT BY MEASURING LINE RESISTANCE OF WORD LINE

(71) Applicant: SAMSUNG ELECTRONICS CO., LTD., Suwon-si (KR)

(72) Inventors: Hwangju Song, Suwon-si (KR); Jaeeun Yoon, Yongin-si (KR); Jiseok Lee, Hwaseong-si (KR); Sangwon Hwang, Suwon-si (KR)

(73) Assignee: Samsung Electronics Co., Ltd.

( * ) Notice: Subject to any disclaimer, the term of this patent is extended or adjusted under 35 U.S.C. 154(b) by 227 days.

(21) Appl. No.: 17/335,963

(22) Filed: Jun. 1, 2021

(65) Prior Publication Data

US 2022/0187365 A1 Jun. 16, 2022

(30) Foreign Application Priority Data

Dec. 15, 2020 (KR) .................. 10-2020-0175296

(51) Int. Cl.
| | |
|---|---|
| *G01R 31/317* | (2006.01) |
| *G11C 16/04* | (2006.01) |
| *G11C 11/08* | (2006.01) |
| *H01L 25/065* | (2023.01) |
| *H01L 25/18* | (2023.01) |
| *H01L 23/00* | (2006.01) |
| *G11C 16/08* | (2006.01) |

(52) U.S. Cl.
CPC . *G01R 31/31724* (2013.01); *G01R 31/31703* (2013.01); *G11C 16/0483* (2013.01); *G11C 16/08* (2013.01); *H01L 24/08* (2013.01); *H01L 25/0657* (2013.01); *H01L 25/18* (2013.01); *H01L 2224/08145* (2013.01); *H01L 2924/1431* (2013.01); *H01L 2924/14511* (2013.01)

(58) Field of Classification Search
None
See application file for complete search history.

(56) References Cited

U.S. PATENT DOCUMENTS

| | | | |
|---|---|---|---|
| 6,330,697 | B1 | 12/2001 | Clinton et al. |
| 6,967,496 | B2 | 11/2005 | Arabi et al. |
| 7,233,132 | B1 | 6/2007 | Dong et al. |

(Continued)

FOREIGN PATENT DOCUMENTS

| | | |
|---|---|---|
| CN | 1585267 A | 2/2005 |
| CN | 103259532 A | 8/2013 |

(Continued)

*Primary Examiner* — Patrick Assouad
*Assistant Examiner* — Haidong Zhang
(74) *Attorney, Agent, or Firm* — Fish & Richardson P.C.

(57) ABSTRACT

A memory device includes; a memory cell array including memory cells, a row decoder selecting a word line in response to a received address, and control logic including a sensing capacitor having a size proportional to a size of a word line capacitor associated with the selected word line. The control logic measures line resistance of the selected word line by precharging the selected word line, performing a charge sharing operation between the selected word line and the sensing capacitor following the precharging of the selected word line, and measuring a voltage of the sensing capacitor following the performing of the charge sharing operation.

20 Claims, 12 Drawing Sheets

(56) References Cited

U.S. PATENT DOCUMENTS

| | | | | |
|---|---|---|---|---|
| 2005/0122767 A1* | 6/2005 | Perner | ............... | G11C 11/16 |
| | | | | 365/158 |
| 2010/0135099 A1* | 6/2010 | Park | ............... | G11C 5/144 |
| | | | | 702/60 |
| 2013/0249575 A1 | 9/2013 | Hertes | | |
| 2020/0135281 A1 | 4/2020 | Kim et al. | | |

FOREIGN PATENT DOCUMENTS

| KR | 1020130108156 A | 10/2013 |
|---|---|---|
| KR | 1020200049937 A | 5/2020 |

* cited by examiner

MEMORY DEVICE DETECTING DEFECT BY MEASURING LINE RESISTANCE OF WORD LINE

CROSS-REFERENCE TO RELATED APPLICATION(S)

This application claims priority to Korean Patent Application No. 10-2020-0175296 filed on Dec. 15, 2020 in the Korean Intellectual Property Office, the subject matter of which is hereby incorporated by reference.

BACKGROUND

The inventive concept relates generally to memory devices.

Nonvolatile memory devices in which memory cells are vertically stacked to improve integration have been actively researched. In particular, as the number of stacked stages increases, the height of metal contact(s) connected to a word line plate also increases. As a result, a contact process associated with connecting wires may be difficult to perform, and a resistance distribution may increase. Accordingly, resistance defects in vertically stacked nonvolatile memory devices may increase.

SUMMARY

Embodiments of the inventive concept provide memory devices capable of detecting possible resistance defects by measuring line resistance of an (open node) word line including a capacitive component.

According to an aspect of the inventive concept, a memory device includes; a memory cell array including memory cells respectively arranged in regions wherein word lines and bit lines intersect, a row decoder configured to select a word line ("the selected word line") from among the word lines in response to a received address, and control logic including a sensing capacitor having a size proportional to a size of a word line capacitor associated with the selected word line, wherein the control logic is configured to measure line resistance of the selected word line by precharging the selected word line, performing a charge sharing operation between the selected word line and the sensing capacitor following the precharging of the selected word line, and measuring a voltage of the sensing capacitor following the performing of the charge sharing operation.

According to an aspect of the inventive concept, a memory device includes; a memory cell array including memory cells respectively arranged in regions wherein word lines and bit lines intersect, a row decoder configured to select one word line ("the selected word line") from among the word lines in response to a received address, and control logic configured to measure line resistance of the selected word line. The control logic includes; a sensing capacitor, a voltage driver providing a charge voltage, a first switch having a first end connected to the voltage driver and a second end, a second switch having a first end connected to the selected word line and a second end connected to the second end of the first switch, a third switch having a first end connected between the first switch and the second switch and a second end, a fourth switch connected in parallel with the sensing capacitor and connected to the second end of the third switch, and a comparator including a first input terminal receiving a sense voltage from the sensing capacitor and a second input terminal receiving a reference voltage.

According to an aspect of the inventive concept, a memory device includes; a memory cell array including memory cells respectively arranged in regions wherein word lines and bit lines intersect, a row decoder configured to select a word line ("the selected word line") from among the word lines in response to a received address, and control logic including a normal unit configured to perform at least one data access operation in relation to a memory cell connected to the selected word line, and a test unit including a sensing capacitor, wherein the test unit is configured to measure line resistance of the selected word line and measure leakage current associated with the selected word line by; performing a charge sharing operation between the selected word line and the sensing capacitor, measuring a voltage of the sensing capacitor during a first time period following the performing of the charge sharing operation to measure the line resistance of the selected word line, and measuring the voltage of the sensing capacitor during a second time period following the first time period to measure the leakage current associated with the selected word line.

BRIEF DESCRIPTION OF DRAWINGS

The above and other aspects, features, and advantages of the inventive concept may be more clearly understood upon consideration of the detailed description together with the accompanying drawings, in which.

DETAILED DESCRIPTION

Hereinafter, certain embodiments of the inventive concept will be described with reference to the accompanying drawings.

Figure 1:
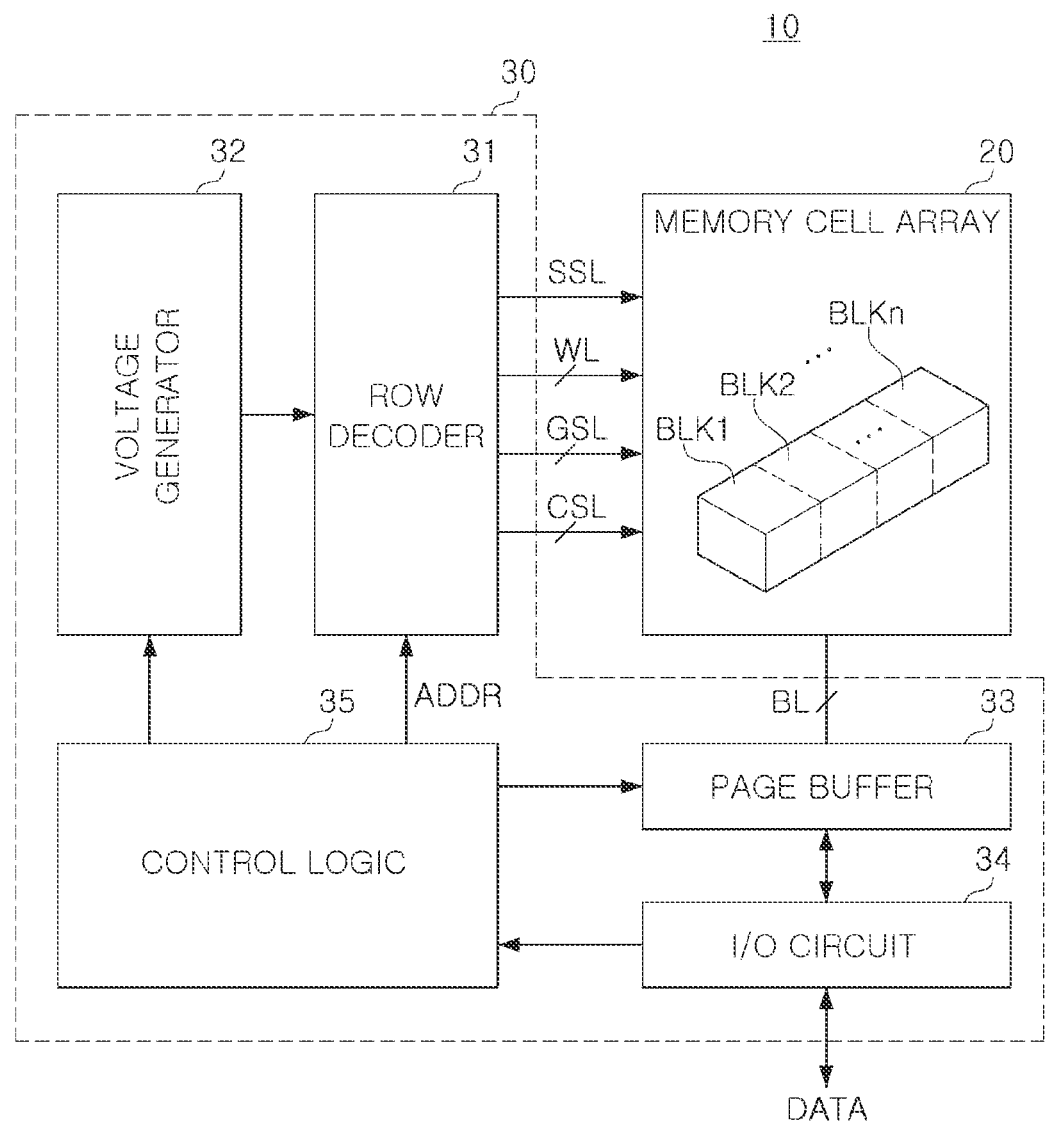
FIG. 1 is a block diagram illustrating a memory device according to embodiment of the inventive concept.

FIG. 1 is a block diagram illustrating a memory device 10 according to embodiments of the inventive concept.

Referring to FIG. 1, the memory device 10 may generally include a cell area 20 and a peripheral circuit area 30 Here, the peripheral circuit area 30 may include a row decoder 31, a voltage generator 32, a page buffer 33, an input/output (I/O) circuit 34, and control logic 35.

The cell area 20 includes memory cells that may be divided into memory blocks (hereafter, "blocks") BLK1 to BLKn. The blocks BLK1 to BLKn may be connected to the row decoder 31 through common source lines CSL, string selection lines SSL, word lines WL, and ground selection lines GSL, and may be further connected to the page buffer 33 through bit lines BL. For example, in each of the blocks BLK1 to BLKn, memory cells arranged at the same height (e.g., a physical level) above a constituent substrate may be connected to the same word line among the word lines WL, and memory cells arranged at the same position in a plane parallel to an upper surface of the substrate may provide memory cell strings that share one channel layer. Also, some of the memory cell strings included respectively in the blocks BLK1 to BLKn may be connected to the same bit line BL.

In response to an address (ADDR) received from the control logic 35 and/or more or more control signals, the row decoder 31 may generate and transmit various voltages driving selected ones of the word lines WL. For example, the row decoder 31 may apply a word line voltage generated by the voltage generator 32 to selected word line(s) in response to one or more control signals provided by the control logic 35. In some embodiments, the row decoder 31 may be connected to the word lines WL through pass transistors, and may apply a word line voltage to selected word line(s) by turning ON corresponding ones of the pass transistors.

The page buffer 33 may be connected to the cell area 20 through the bit lines BL, and may be used to read data stored in the memory cells or write data to the memory cells. The page buffer 33 may include a column decoder, a latch circuit, or the like. In this regard, the column decoder may select at least one of the bit lines BL, and the latch circuit may read data from a memory cell connected to a bit line BL selected by the column decoder during a read operation.

The I/O circuit 34 may receive externally-provided write data (DATA) received through the page buffer 33 during a program operation, and/or provide read data retrieved by the page buffer 33 from the cell area 20 during a read operation. The I/O circuit 34 may also transmit an address and/or command received from an external source (e.g., a memory controller) to the control logic 35.

The control logic 35 may control the overall operation of (and the inter-operation between) the row decoder 31, the voltage generator 32, the page buffer 33, and the I/O circuit 34. In some embodiments, the control logic 35 may in response to one or more control command(s) received from external source(s).

The voltage generator 32 may be used to generate control voltages (e.g., a program voltage, a read voltage, an erase voltage, a pass voltage, etc.) necessary to the operation of the memory device 10 in relation to an externally-provided power supply voltage. The voltage generated by the voltage generator 32 may be provided to the peripheral circuit area 30 and/or the cell area 20 through the row decoder 31 or the like.

Three dimensional (3D or vertically stacked) memory devices provide improved memory cell integration density. However, as the number of stacked stages in these 3D memory device increases, the height of a metal contact connected to a word line plate also increases. This extended-height metal contact may increase a resistance distribution in relation to one or more fabrication process(es), thereby causing resistance defect(s) in the memory device.

Recognizing this particular failure potential and similar problems, methods have been proposed whereby defects in a memory device may be detected, and possibly corrected. Such methods may include programming data to a memory cell and then determining whether the programmed data may be properly read. However, a word line formed of a gate is an "open node" including an intrinsic capacitor component (hereafter, a "word line capacitor"), such that the open node has recovery characteristics in which resistance decreases at high voltages. In order to program data to a memory cell, a high voltage is usually applied, and here, if the memory device is tested by the method of programming/reading, the memory device may be detected as operating normally due to the recovery characteristics of the open node. However, if in this case, data when programmed to the memory cell and left for long periods of time, resistance may again increase. Thereafter, if a low voltage is applied to read the data programmed in the memory cell after a product including the memory device is commercially released, the data may not be read properly. Accordingly, the reliability of the data cannot ensured.

Unfortunately, until the advent inventive concept, there has been no available method for accurately measuring the line resistance of an open node. And in the case of a word line used to program and read data from memory cells, it is additionally difficult to accurately measure line resistance of the word line because of changes in the threshold voltage(s) of the memory cell(s). However, embodiments of the inventive concept fully address this existing limitation and provide methods by which the line resistance of (open node) word lines may be accurately measured (or determined), thereby enabling the identification of potential defects in the memory device.

According, in the memory device 10 of FIG. 1, line resistance of a word line may be accurately measured by adding circuitry (e.g., control logic circuitry) for measuring line resistance of the word line. In some embodiments, this circuitry for measuring line resistance of the word line may include a sensing capacitor and a switch controlling the sensing capacitor, wherein the size of the sensing capacitor may be proportional to (or matched with) the size of the word line capacitor.

In order to measure line resistance of the word line, a low voltage may initially be applied to the word line to provide electrical charge in the word line capacitor. Thereafter, a charge sharing operation may be performed allowing the sensing capacitor to "share" the electrical charge accumulated by the word line capacitor. After a certain period of time, line resistance of the word line may then be accurately measured by determining a voltage of the sensing capacitor. Using this approach, it is possible to effectively detect resistance defects in the memory device.

Additionally, leakage current associated with the word line capacitor may be measured by repeatedly measuring a voltage of the sensing capacitor. Therefore, line resistance of the word line and a leakage current of the word line may be accurately and simultaneously (e.g., overlapping in time, at least in part).

Figure 2:
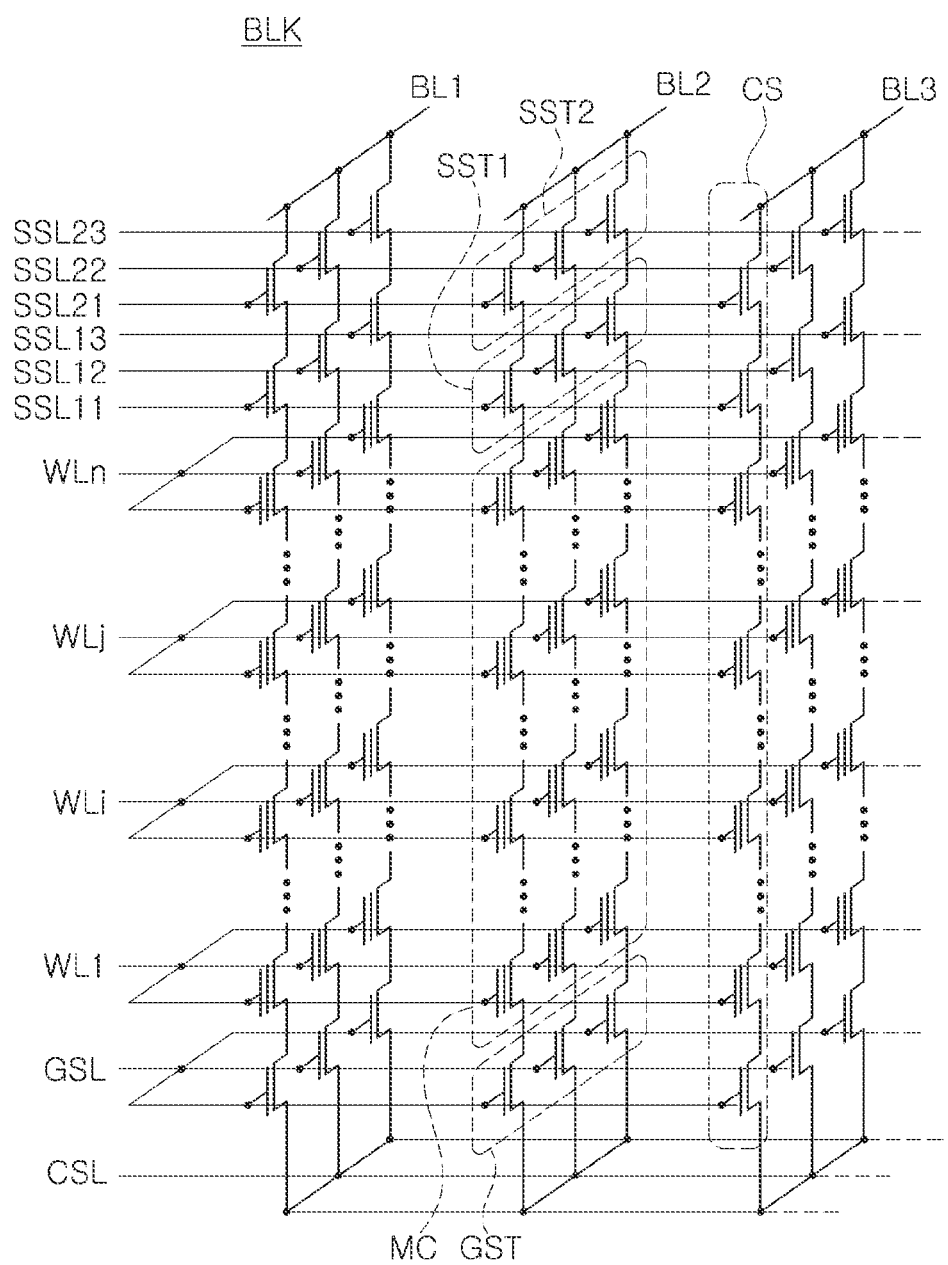
FIG. 2 is a partial equivalent circuit diagram and FIG. 3 is a cross-sectional diagram further illustrating a memory device according to embodiments of the inventive concept.
Figure 3:
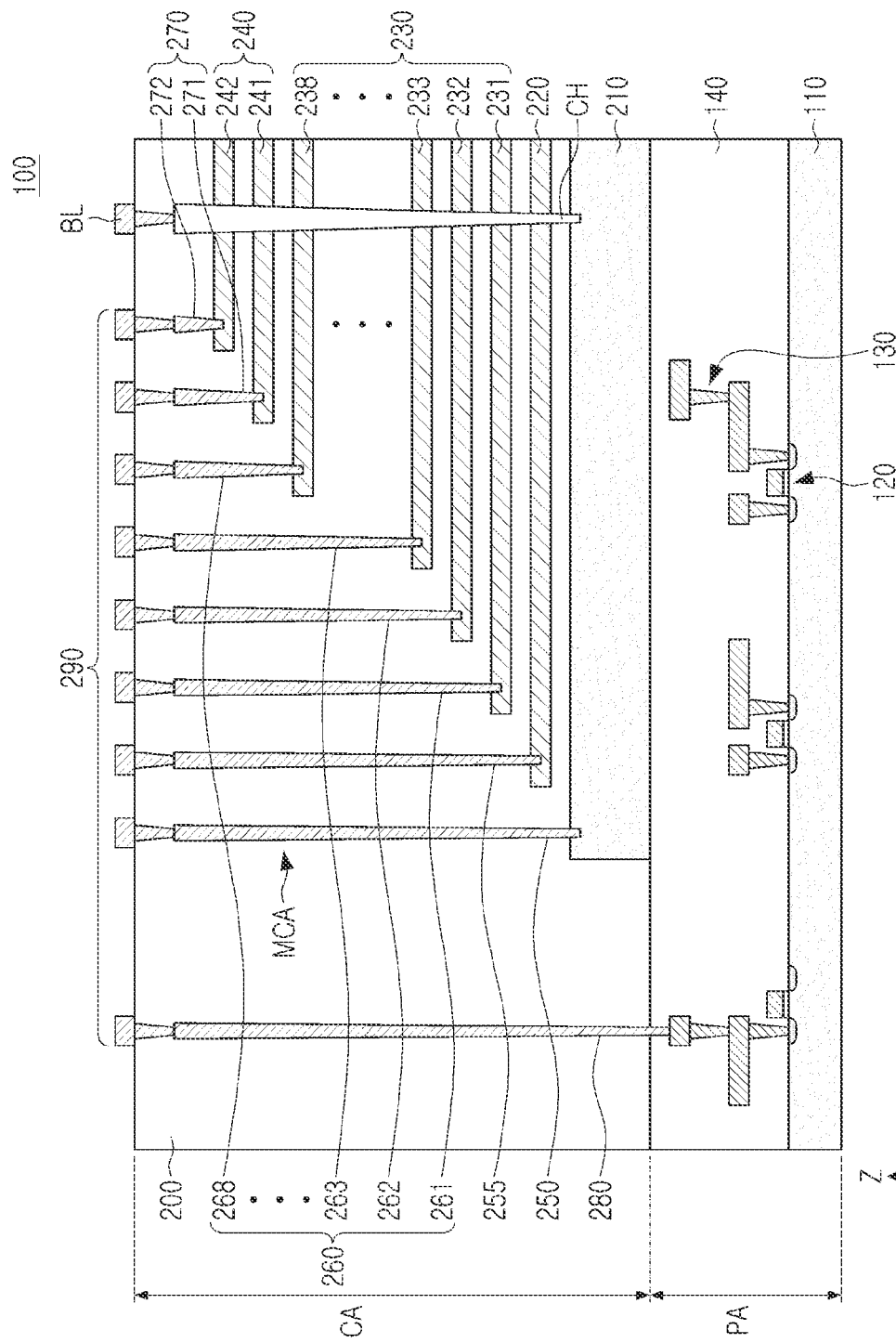

FIG. 2 is a partial equivalent circuit diagram, and FIG. 3 is a cross-sectional diagram. Collectively, FIGS. 2 and 3 further illustrate a memory device according to embodiments of the inventive concept.

Referring to FIG. 2, an exemplary memory block BLK may include memory cell strings CS, wherein at least some of the memory cell strings CS share word lines WL1 to WLn and/or bit lines BL1 to BL3.

Each of the memory cell strings CS may include memory cells MC connected between first and second string selection transistors SST1 and SST2 and a ground selection transistor GST. The first and second string selection transistors SST1 and SST2 are connected in series to each other, and the second string selection transistor SST2 disposed above may be connected to one of the bit lines BL1 to BL3. The ground selection transistor GST may be connected to the common source line CSL. The memory cells MC included in each of the memory cell strings CS may share one channel region.

The memory cells MC may be connected in series between the first and second string selection transistors SST1 and SST2 and the ground selection transistor GST. In some embodiments, the number of string selection transistors SST1 and SST2 and the ground selection transistor GST may vary, and each of the memory cell strings CS may further include at least one dummy memory cell. For example, the dummy memory cells may be connected between the first string selection transistor SST1 and the memory cells MC and/or between the ground selection transistor GST and the memory cells MC.

Gate electrodes of the memory cells MC may be connected to the word lines WL1 to WLn. In addition, a gate electrode of the ground selection transistor GST is connected to the ground selection line GSL, and gate electrodes of the first and second string selection transistors SST1 and SST2 may be connected to the string selection lines SSL11 to SSL23.

The ground selection line GSL, the word lines WL1 to WLn, and the string selection lines SSL11 to SSL23 may be vertically stacked. The ground selection line GSL, the word lines WL1 to WLn, and the string selection lines SSL11 to SSL23 may be penetrated by a channel structure including a channel region. The channel structure may be connected to one of the bit lines BL1 to BL3.

Referring to FIG. 3, a memory device 100 according to embodiments of the inventive concept may include a peripheral circuit area PA and a cell area CA. The memory device 100 may have a "cell on peri" or "cell over peri" (COP) structure. The COP structure is a structure in which the peripheral circuit area PA is disposed under the cell area CA. That is, at least a portion of the peripheral circuit area PA and at least a portion of the cell area CA may overlap in the vertical direction (e.g., the stacking direction or the Z-axis direction).

The peripheral circuit area PA may include a lower substrate 110, circuit elements 120 disposed on the lower substrate 110, circuit wirings 130 electrically connected to the circuit elements 120, and a lower insulating layer 140 covering the circuit elements 120 and the circuit wirings 130. Peripheral circuits (e.g., a row decoder, page buffer, etc.) necessary to the driving of the memory device 100 may be disposed in the peripheral circuit area PA.

The lower substrate 110 may include a semiconductor substrate such as a silicon wafer. The circuit elements 120 may refer to an integrated circuit including a transistor or the like. The circuit wirings 130 may include metal layers and metal contacts. The metal contacts may connect the circuit elements 120 to the metal layers and may connect the metal layers. The lower insulating layer 140 may include an insulating material such as silicon oxide or silicon nitride.

The cell area CA may provide at least one memory block. The cell area CA may include an upper substrate 210, a memory cell array MCA disposed on the upper substrate 210, and an upper insulating layer 200 covering the memory cell array MCA. At least a portion of the upper substrate 210 may be a common source line.

Word lines 231 to 238 (or collectively 230) may be stacked in the vertical direction substantially perpendicular to an upper surface of the upper substrate 210. String selection lines 241, 242; 240 may be disposed above the word lines 230, a ground selection line 220 may be disposed below the word lines 230, and the word lines 230 may be disposed between the string selection lines 240 and the ground selection line 220. The ground selection line 220, the word lines 230, and the string selection lines 240 may refer to gate electrode layers.

A channel structure CH may extend in the vertical direction and penetrate the word lines 230, the string selection lines 240, and the ground selection line 220. The channel structure CH may include a data storage layer, a channel layer, and an embedded insulating layer, and the channel layer may be electrically connected to a bit line BL through a bit line contact. The bit line BL may extend in a first horizontal direction (e.g., a Y-axis direction) substantially parallel to the upper surface of the upper substrate.

The gate electrode layers 220, 230, and 240 may extend in different lengths in a second horizontal direction (e.g., a X-axis direction) also substantially parallel to the upper surface of the upper substrate 210 and intersecting the first horizontal direction. Gate contact plugs 250, 255, 260, and 270 may be connected to each other in pads provided as the gate electrode layers 220, 230, and 240 extend in different lengths. For example, the cell contact plugs 261 to 268; 260 may be connected to each other in pads provided as the word lines 230 extend in different lengths. The cell contact plugs 260 may be electrically connected to circuit elements 120 providing a row decoder in the peripheral circuit area PA.

The peripheral contact plug 280 may be electrically connected to at least one of the circuit elements 120 disposed in the peripheral circuit area PA. The peripheral contact plug 280 and the gate contact plugs 250, 255, 260, and 270 may be connected to the gate connection wirings 290 through metal contacts. For example, the word lines 230 may be connected to a row decoder included in the peripheral circuit area PA through cell contact plugs 260, gate connection wirings 290, and peripheral contact plugs 280. The row decoder may supply voltages for driving the word lines to the word lines 230.

As noted above, when the number of stacking stages of the memory device increases, a height of the cell contact plug 260 connected to the word line 230 may also increase. This result may cause resistive defect(s) to form in the memory device 100. Therefore, it is necessary to accurately measure line resistance of the word line 230.

In the present detailed description, the phrase "line resistance of the word line" denotes resistance associated with a path between the word line and the peripheral circuit area. Specifically, line resistance of the word line may refer to a resistance existing in a path between the word line and the row decoder. For example, line resistance of a first word line 231 may refer to resistance present in the first cell contact plug 261, the gate connection wirings 290, and the peripheral contact plug 280, which is a path between the first word line 231 and the peripheral circuit area PA. However, since the number of peripheral contact plugs 280 is very small compared to the number of cell contact plugs 260, several peripheral contact plugs 280 may be redundantly arranged and connected in parallel to reduce an influence of resistance due to the peripheral contact plug 280. Accordingly, resistance of the cell contact plug 260 has the greatest influence on line resistance of the word line 230.

In the memory device 100 of FIG. 3, line resistance of a word line among the word lines 230 may be accurately measured by adding a sensing capacitor and a switch for controlling the sensing capacitor. In addition, line resistance of the word line 230 and a leakage current of the word line 230 may be simultaneously measured by repeatedly measuring a voltage of the sensing capacitor.

Figure 4:
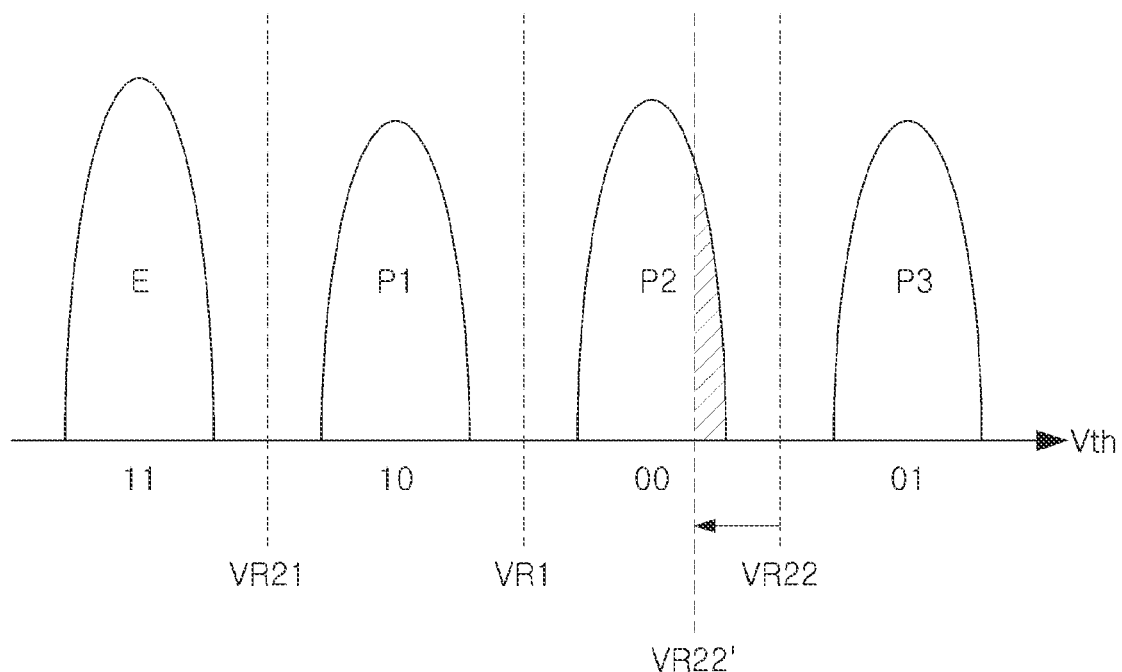
FIG. 4 is a waveform diagram illustrating a cell distribution for a memory device according to embodiments of the inventive concept.

FIG. 4 is a waveform diagram illustrating a cell distribution for a memory device according to embodiments of the inventive concept.

Here, it is assumed that the memory device includes multi-level memory cells (MLC) capable of programming two or more bits in a single memory cell. Accordingly, FIG. 4 shows a cell distribution for a 2-bit MLC, wherein the 2-bit MLC may be programmed into one of four possible states ("E", "P1", "P2", and "P3"). Two bits programmed in one memory cell may include an upper bit and a lower bit. A page for the upper bit and a page for the lower bit are programmed into memory cells connected to the same word line in the memory cell array. Before the program is executed, all memory cells have the state "E". When a program of a first page is executed in relation to memory cells, memory cells in which a logic value of a corresponding bit is 0 are programmed to have a state "P", and memory cells in which a logic value of a corresponding bit is 1 are maintained in the state "E". Thereafter, when a program of a second page is executed, the memory cells have one of a state "E", a state "P1", a state "P2", and a state "P3". Here, memory cells in which the logic value of the bit in the first page is 1 and the logic value of the bit in the second page is 1 are maintained at the state "E", and memory cells in which a logic value of the bit in the first page is 1 is the logic value of the bit in the second page is 0 are programmed to have the state "P1". In addition, memory cells in which the logic value of the bit in the first page is 0 and the logic value of the bit in the second page is 0 are programmed from the state "P" to the state "P2", and the memory cells in which the logic value of the bit in the first page is 0 and the logic value of the bit in the second page is 1 are programmed from the state "P" to the state "P3". In this manner, the memory cells in which the program of the first page and the program of the second page have been completed have a cell distribution as shown in FIG. 4. To read the logic values thereof, read voltages VR1, VR21, and VR22 may be used. When the read voltage VR1 is applied, the memory cells in the state "E" and the state "P1" are turned ON, and the memory cells in the state "P2" and the state "P3"s are turned OFF. By detecting this, it is possible to determine whether the bit value of the first page of the corresponding memory cell is 0 or 1. That is, when the read voltage VR1 is applied, if a memory cell is turned ON, an upper bit of data stored in the memory cell is 1, and if the memory cell is turned OFF, the upper bit of the data stored in the memory cell is 0. The read voltages VR21 and VR22 may be used to know logic values of the second page. If an ON/OFF state of the memory cell when the read voltage VR21 is applied and an ON/OFF state of the memory cell when the read voltage VR22 is applied are the same, the lower bit of the data stored in the memory cell is 1. If the ON/OFF states are different from each other, the lower bit of the data stored in the memory cell is 0.

Since the word line, an open node, has recovery characteristics, when a high voltage is applied to the word line to program data in the memory cell, line resistance of the word line decreases so that data may be normally programmed in the memory device. However, line resistance of the word line increases again after a long period of time, and a read voltage may change when a low voltage is applied to the word line to read data programmed in the memory cell.

For example, the first read voltage VR22 may be reduced to a second read voltage VR22' due to line resistance of the word line. Here, a distribution portion of the state P2 exceeding the second read voltage VR22' may cause an error in a read process. In this case, reliability of the data cannot be guaranteed.

In some embodiments, the word line capacitor may be charged using a low voltage, a charge sharing operation that shares electrical charge between the word line capacitor and the sensing capacitor may be performed, and a voltage of the sensing capacitor may be measured, thereby accurately measuring line resistance of the word line. In this manner, resistive defects in the memory device may be detected. In addition, line resistance for the word line and a leakage current associated with the word line may be simultaneously measured by repeatedly measuring a sense voltage of the sensing capacitor.

Figure 5:
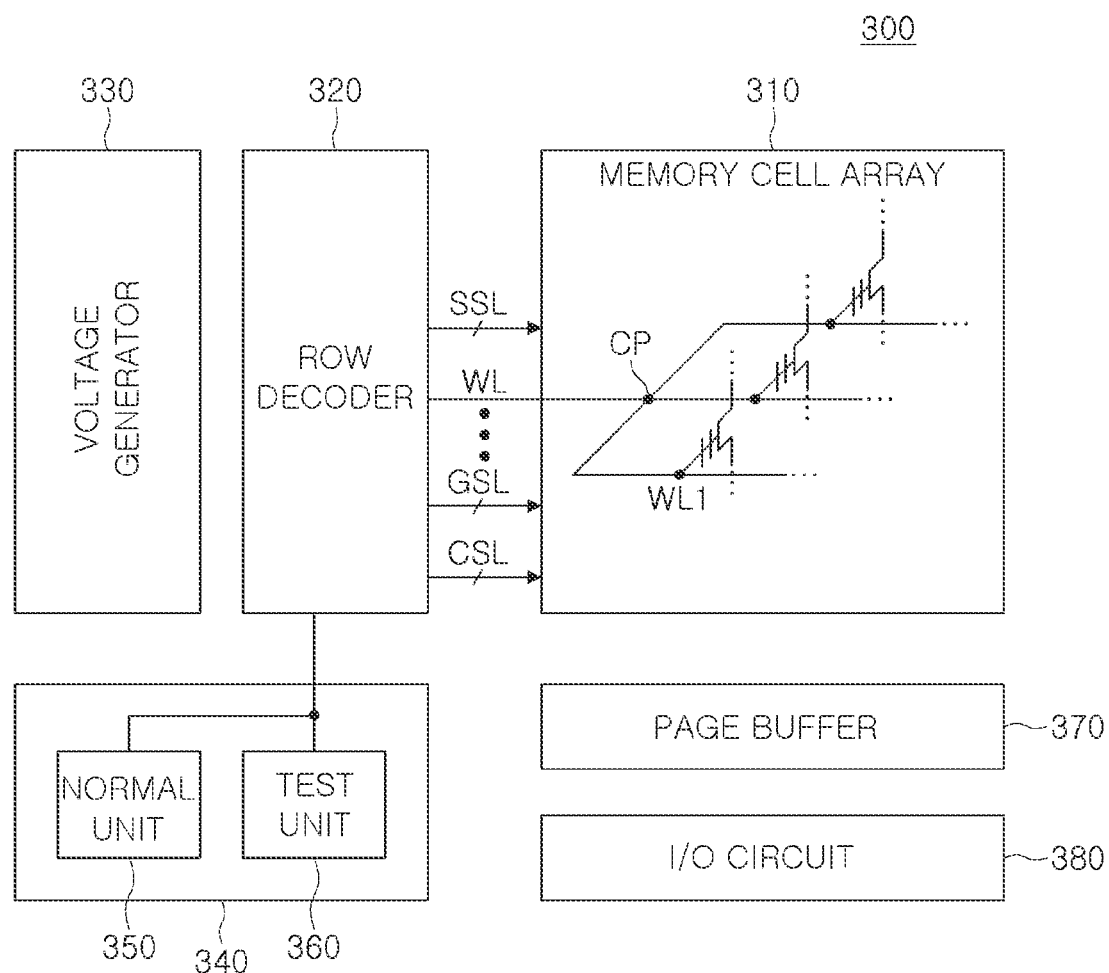
FIG. 5 is a block diagrams illustrating a memory device according to embodiments of the inventive concept.
Figure 6:
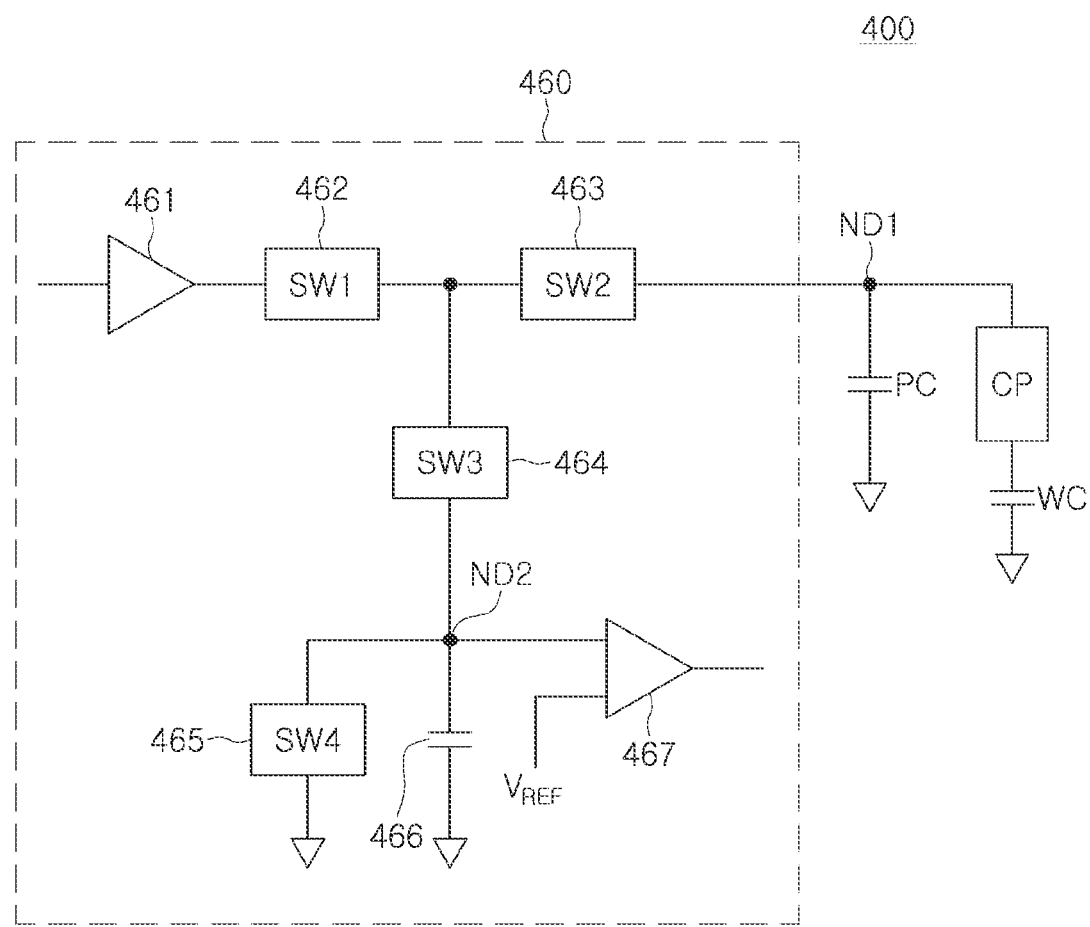
FIG. 6 is an equivalent circuit diagram for the memory device of FIG. 5.

FIG. 5 is a block diagrams illustrating a memory device according to embodiments of the inventive concept, and FIG. 6 is an equivalent circuit diagram for the memory device of FIG. 5.

Referring to FIG. 5, a memory device 300 may include a memory cell array 310, a row decoder 320, a voltage generator 330, a control logic 340, a page buffer 370, and an I/O circuit 380. The memory cell array 310 may be connected to the row decoder 320 through common source lines CSL, string select lines SSL, word lines WL, and ground select lines GSL.

The memory cell array 310 may include memory cells respectively arranged in regions wherein word lines and bit lines intersect. Here, the memory cell array 310 may have substantially the same structure as the cell area described in relation to FIG. 2.

The row decoder 320 may an address received from the control logic 340 or the like and generate various voltages for driving the word line WL. The row decoder 320 may input a word line voltage generated by the voltage generator 330 to the word lines WL in response to the control of the control logic 340.

The control logic 340 may include a data access unit 350 (shown as a "normal unit" in FIG. 5) and a test unit 360. Here, the data access unit 350 may operate in substantially way and have substantially the same structure as the control logic described in relation to FIG. 1. That is, the data access unit 350 may be used to control the performing of various data access operations (e.g., read operations, program operations and/or erase operations) using the row decoder 320, the voltage generator 330, the page buffer 370, and/or the I/O circuit 380 in response to externally-provided control signal (s), address(es), and/or command(s).

The test unit 360 may be used to measure line resistance of the word line WL using a sensing capacitor. For example, the row decoder 320 may select a first word line WL1 whose line resistance is to be measured from among the word lines WL in response to an address received from the control logic 340. In this regard, the first word line WL1 may be understood as "the selected word line." The test unit 360 may then precharge the first word line WL1 by providing a low voltage to the first word line WL1. That is, electrical charge may be provided to the word line capacitor of the first word line WL1. The test unit 360 may then perform a charge sharing operation which shares the provided electrical charge between the precharged first word line WL1 and the sensing capacitor. The test unit 360 may then measure a voltage of the sensing capacitor following completion of the charge sharing operation. In this manner, the test unit 360 may accurately measure line resistance of the word line using the voltage of the sensing capacitor.

A path between the test unit 360 and the first word line WL1 may be further understood upon consideration of the equivalent circuit of FIG. 6. As described above, since line resistance of the word line has the greatest effect of resistance by the cell contact plug CP, the path between the test unit 460 and the word line may be represented by a cell contact plug CP, a word line capacitor WC, and a parasitic capacitor PC. Thus, the term "word line capacitor" denotes a capacitive component ("capacitor") existing between a selected word line and adjacent word line(s) (or word line(s) proximate to the selected word line), whereas the term "parasitic capacitor" denotes a capacitive component ("capacitor") existing between wiring connecting the selected word line and adjacent wirings (or wirings proximate to the wirings).

In some embodiments, the test unit 460 may include a voltage driver 461, first, second, third and fourth (hereafter collectively "first to fourth") switches 462, 463, 464 and 465 (hereafter collectively "462 to 465"), a sensing capacitor 466, and a comparator 467. The sensing capacitor 466 may refer to a transistor capacitor, a metal-insulator-metal (MIM) capacitor, or the like. A size of the sensing capacitor 466 may be proportional to a size of the word line capacitor WC.

An output of the voltage driver 461 may be connected to a first end of the first switch 462, and a first node ND1 connected to the word line may be connected to a first end of the second switch 463. A second end of the first switch 462 and a second end of the second switch 463 may be commonly connected. A first end of the third switch 464 may be connected between the first switch 462 and the second switch 463. A second end of the third switch 464 may be connected to a sensing node ND2. The fourth switch 465 and the sensing capacitor 466 may be connected in parallel and may be commonly connected to the sensing node ND2.

The first switch 462 may connect the word line to the voltage driver 461, and the third switch 464 may connect the word line to the sensing capacitor 466. The fourth switch 465 may initialize the sensing capacitor 466.

A first input terminal of the comparator 467 may be connected to the sensing node ND2 to receive a voltage from the sensing capacitor 466, and a second input terminal of the comparator 467 may receive a reference voltage $V_{REF}$. The comparator 467 may compare a voltage of the sensing capacitor 466 with the reference voltage $V_{REF}$ and output a comparison signal corresponding to a result of the comparison.

FIGS. 7 through 10 are a related set of block diagrams and voltage waveform diagrams illustrating an exemplary operation of a memory device according to embodiments of the inventive concept.

Here, an exemplary method of measuring line resistance of a word line in a memory device will be described. In this regard and referring to FIGS. 7 and 9, during a precharge period D1, the first switch 462, the second switch 463, and the fourth switch 465 may be turned ON, and the third switch 464 may be turned OFF. As the fourth switch 465 is turned ON, the sensing node ND2 may be initialized. As the first switch 462 and the second switch 463 are turned ON, a charge voltage may be supplied from the voltage driver 461 to the word line. For example, the charge voltage may be a low voltage in the range of 3V to 5V, but is not limited thereto. Electrical charge may be provided to the word line capacitor WC and the parasitic capacitor PC by a low voltage supplied from the voltage driver 461.

The voltage driver 461 may provide electrical charge to the word line capacitor WC through a first path PATH1 and provide electrical charge to the parasitic capacitor PC through a second path PATH2. A cell contact plug CP that has the greatest influence on line resistance of the word line may be present on the first path PATH1. As described above, if a high voltage is applied to the word line, recovery characteristics that resistance of the cell contact plug CP decreases may occur, and thus a low voltage may be supplied to the word line in order to exclude recovery characteristics.

Figure 9:
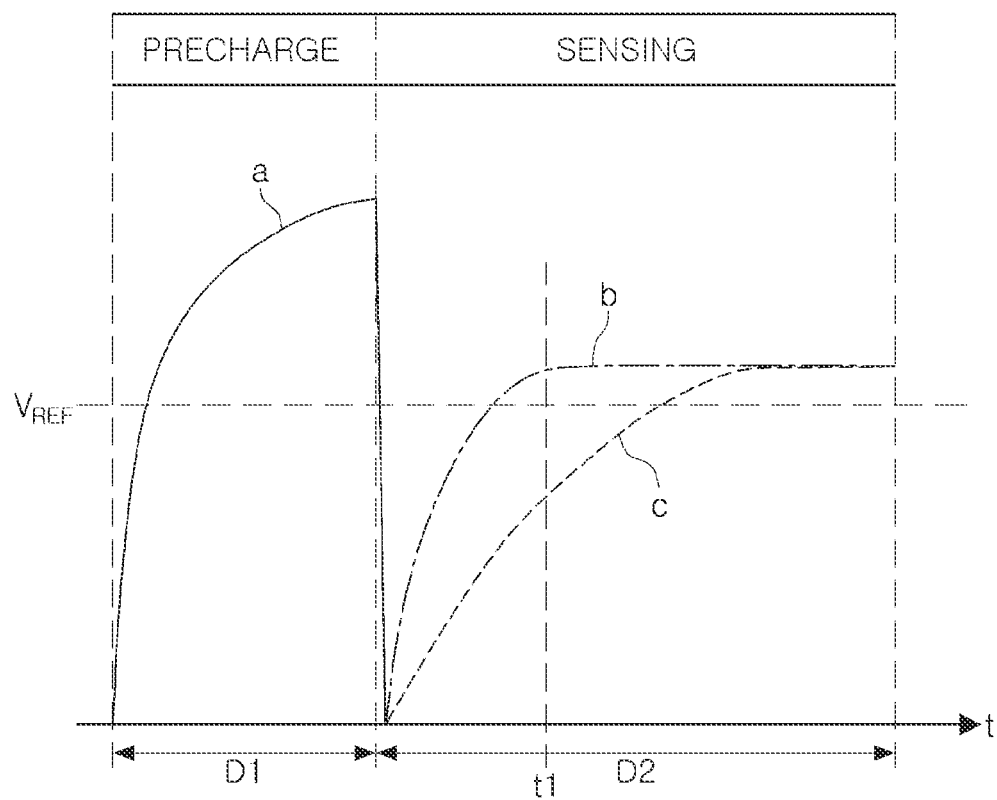

As electrical charge is provided to the word line capacitor WC and the parasitic capacitor PC, a voltage of the first node ND1 will increase as shown by line 'a' in the graph of FIG. 9.

Figure 8:
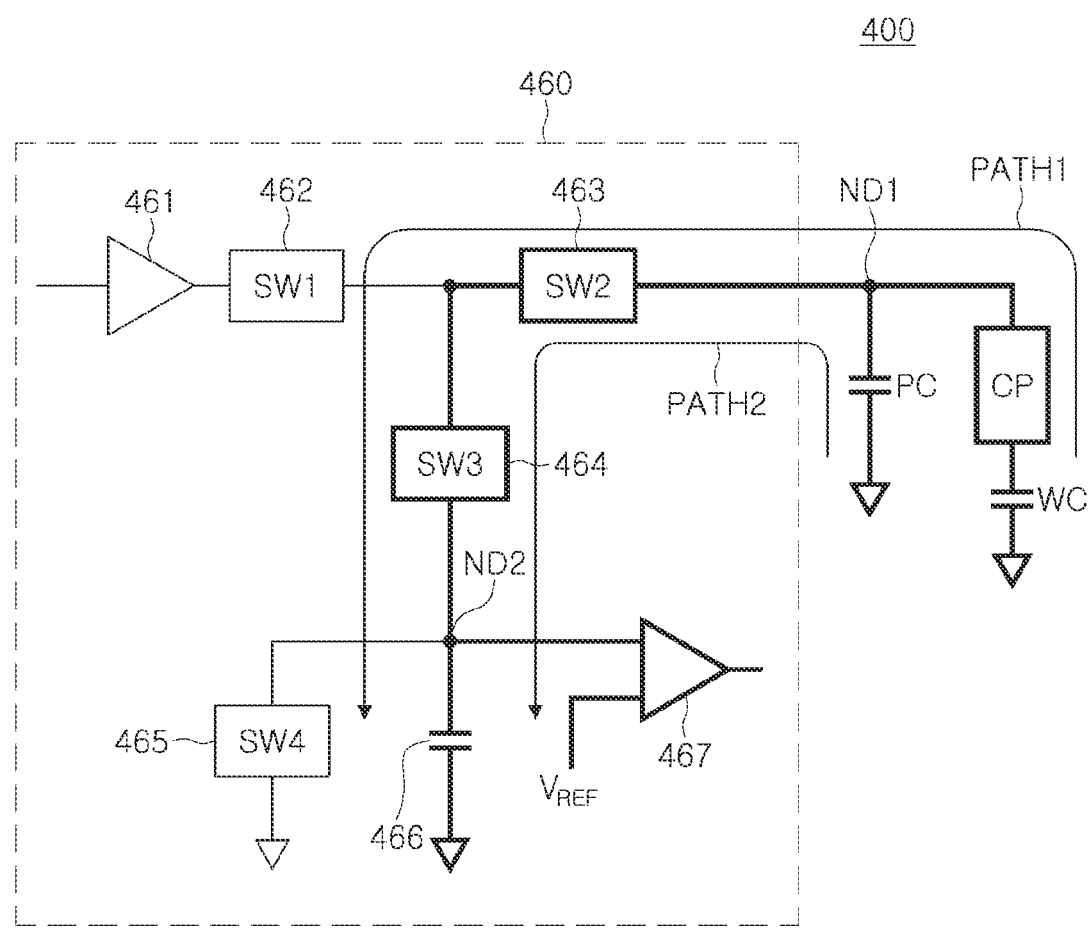

Referring to FIGS. 8 and 9 together, during a sensing period D2, the first switch 462 and the fourth switch 465 may be turned OFF and the second switch 463 and the third switch 464 may be turned ON. As the second switch 463 and the third switch 464 are turned ON, a charge sharing operation that shares the electrical previously provided charge between the word line capacitor WC, the parasitic capacitor PC, and the sensing capacitor 466 may be performed.

The provided electrical charge associated with the word line capacitor WC may be shared with the sensing capacitor 466 through the first path PATH1, and the provided electrical charge associated with the parasitic capacitor PC may be shared with the sensing capacitor through the second path PATH2.

The voltage of the first node ND1 may sharply decrease (near instantaneously) and then gradually increase according to a voltage of the second node ND2. Thus, the voltage of the second node ND2 may increase as shown in the lines 'b' and 'c' shown in the graph of FIG. 9. A cell contact plug CP that has the greatest influence on line resistance of the word line may be associated with the first path PATH1. Also, a size of the parasitic capacitor PC may be very small, as compared with the size of the word line capacitor WC. Accordingly, a time constant of the voltage of the second node ND2 may be determined by resistance of the cell contact plug CP and the word line capacitor WC. In addition, when resistance of the cell contact plug CP is small, the voltage of the second node ND2 increases relatively sharply as shown in graph line b', and when resistance of the cell contact plug CP is large, the voltage of the second node ND2 may increase relatively slowly as shown in graph line 'c'.

After the charge sharing operation is completed (following a predetermined period of time), the third switch 464 may be turned OFF. A time at which the third switch 464 is turned ON/turned OFF may be determined by the word line capacitor and a normal line resistance value of the word line. After the third switch 464 is turned OFF, the comparator 467 may receive the voltage of the second node ND2 and the reference voltage $V_{REF}$. The comparator 467 may compare the voltage of the second node ND2 and the reference voltage $V_{REF}$ at a first point in time t1 (or during a first time period). If the voltage of the second node ND2 is greater than the reference voltage $V_{REF}$ as a result of the comparison, (graph line b'), it may be determined that line resistance of the word line is small. Conversely, if the voltage of the second node ND2 is less than the reference voltage $V_{REF}$ as a result of the comparison (graph line 'c'), it may be determined that line resistance of the word line is large.

Figure 7:
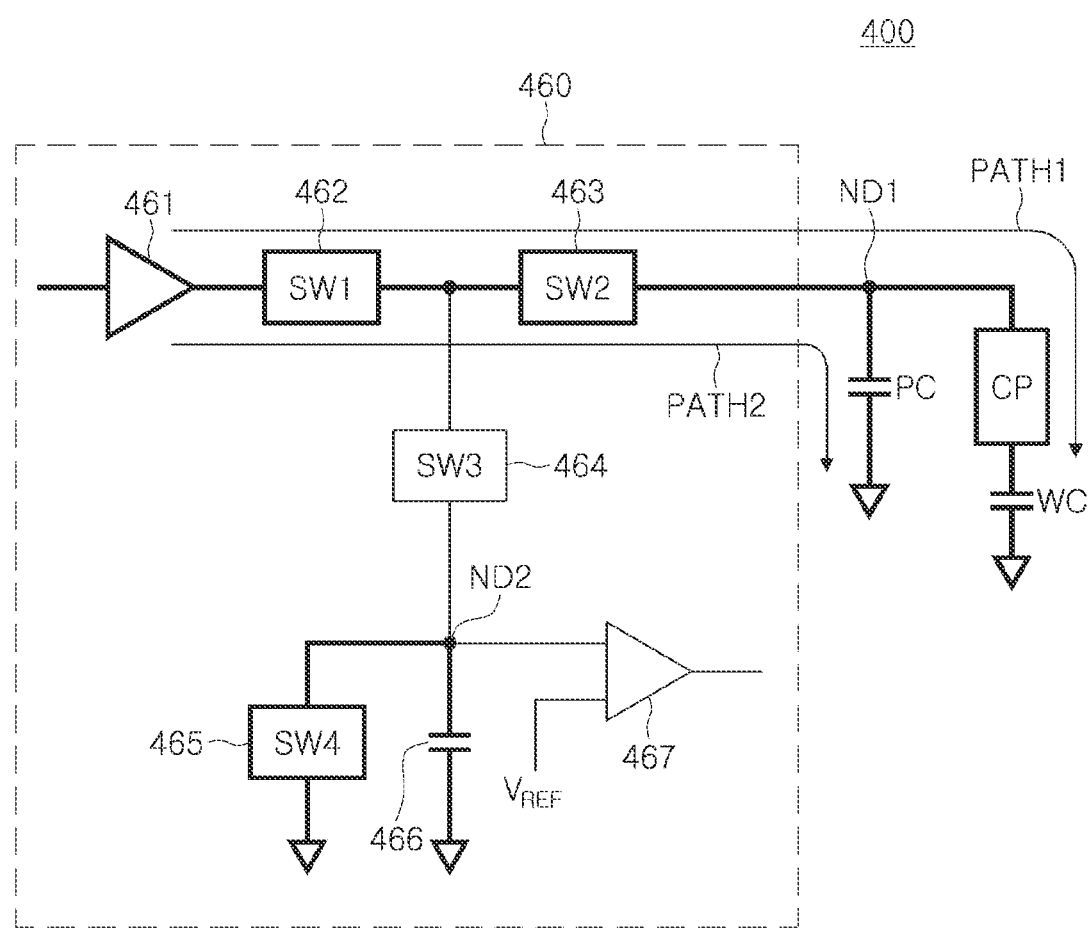
FIGS. 7, 8, 9 and 10 (hereafter collectively, "FIGS. 7 to 10") are a related set of block diagrams and voltage waveform diagrams illustrating an exemplary operation of a memory device according to embodiments of the inventive concept.

The memory device 400 of FIG. 7 may accurately measure line resistance of the word line by measuring a voltage of the sensing capacitor 466. Therefore, when it is determined that line resistance of the word line is large (graph line 'c'), it may be determined that a resistive defect has occurred in the word line.

Figure 10:
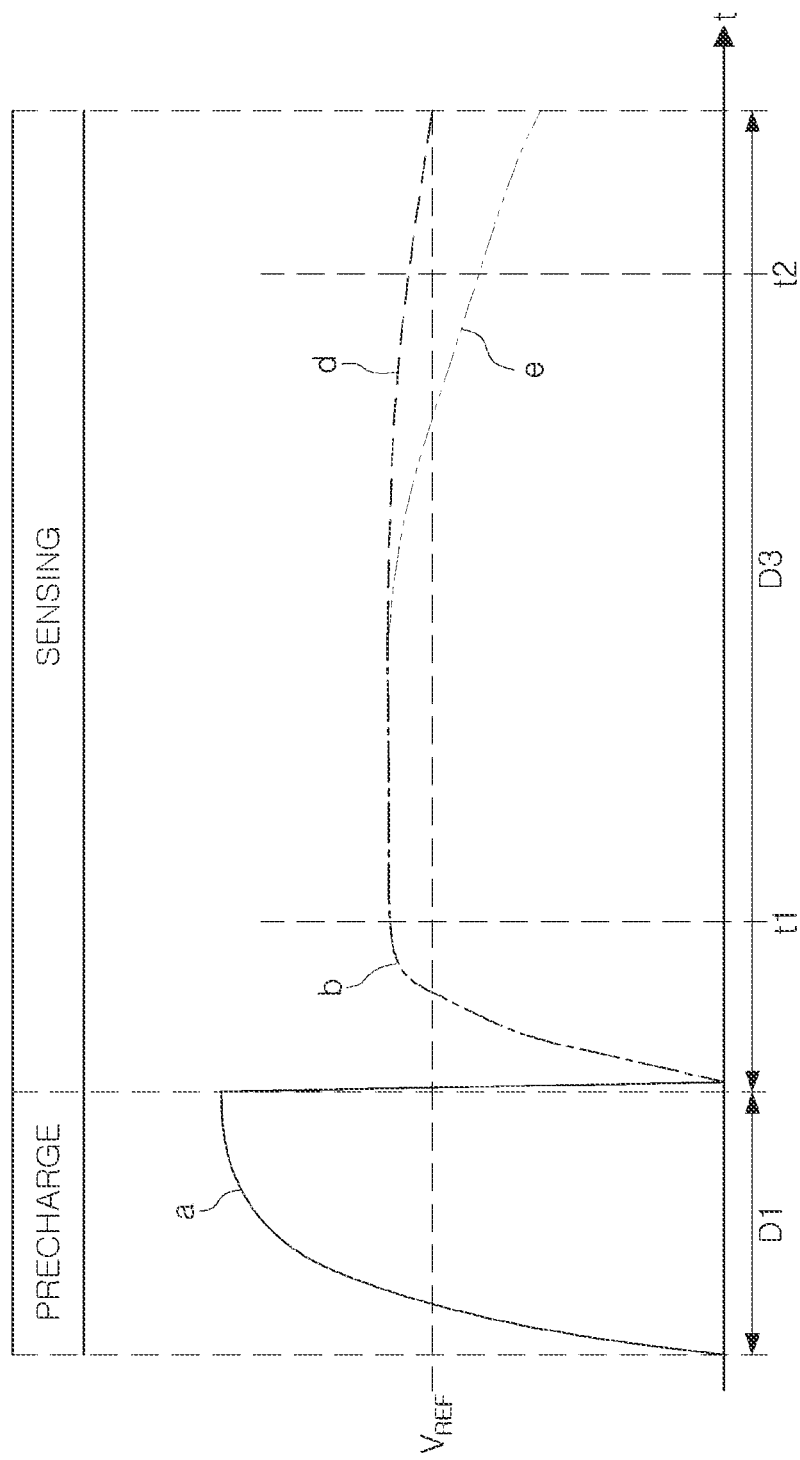

Referring to FIGS. 8 and 10, when it is determined that line resistance of the word line is small, the memory device may be further evaluated for defect by measuring leakage current associated with the word line. After the word line is precharged, leakage current may occur in the word line capacitor WC over time. Thus, when the third switch 464 is turned ON again, the voltage of the second node ND2 may decrease due to the leakage current. If the amount of leakage current occurring in the word line capacitor WC is large, the voltage of the second node ND2 may decrease relatively sharply as shown in the line 'e' of the graph of FIG. 10, and when the amount of leakage current occurring in the word line capacitor WC is small, the voltage of the second node ND2 may decrease relatively gradually as shown in the line 'd' of the graph of FIG. 10.

The comparator 467 may receive the voltage of the second node ND2 and the reference voltage $V_{REF}$. After turning ON the third switch 464 again, the comparator 467 may compare the voltage of the second node ND2 with the reference voltage $V_{REF}$ at a second point in time t2 (or during a second time period). If the voltage of the second node ND2 is greater than the reference voltage $V_{REF}$ as a result of the comparison (graph line 'd'), it may be determined that the amount of leakage current occurring in the word line capacitor WC is small Conversely, if the voltage of the second node ND2 is less than the reference voltage $V_{REF}$ as the result of the comparison (graph line 'e'), it may be determined that the amount of leakage current occurring in the word line capacitor WC is large.

Accordingly, when the graph line 'b' and the graph line 'd' in which the voltage of the second node ND2 increase relatively sharply and decrease gradually are satisfied, it may be determined that the memory device is free from defects and operating normally.

When measuring line resistance of the word line, the voltage of the sensing capacitor may be sensitive to a time constant determined by line resistance of the word line and the word line capacitor. This is because line resistance of the word line is large. Therefore, when measuring line resistance of the word line, the voltage of the sensing capacitor may be measured after turning OFF the third switch 464. However, when the leakage current of the word line is measured, it has already been determined that line resistance of the word line is small, and thus, the voltage of the sensing capacitor may not be sensitive to the time constant.

Figure 11:
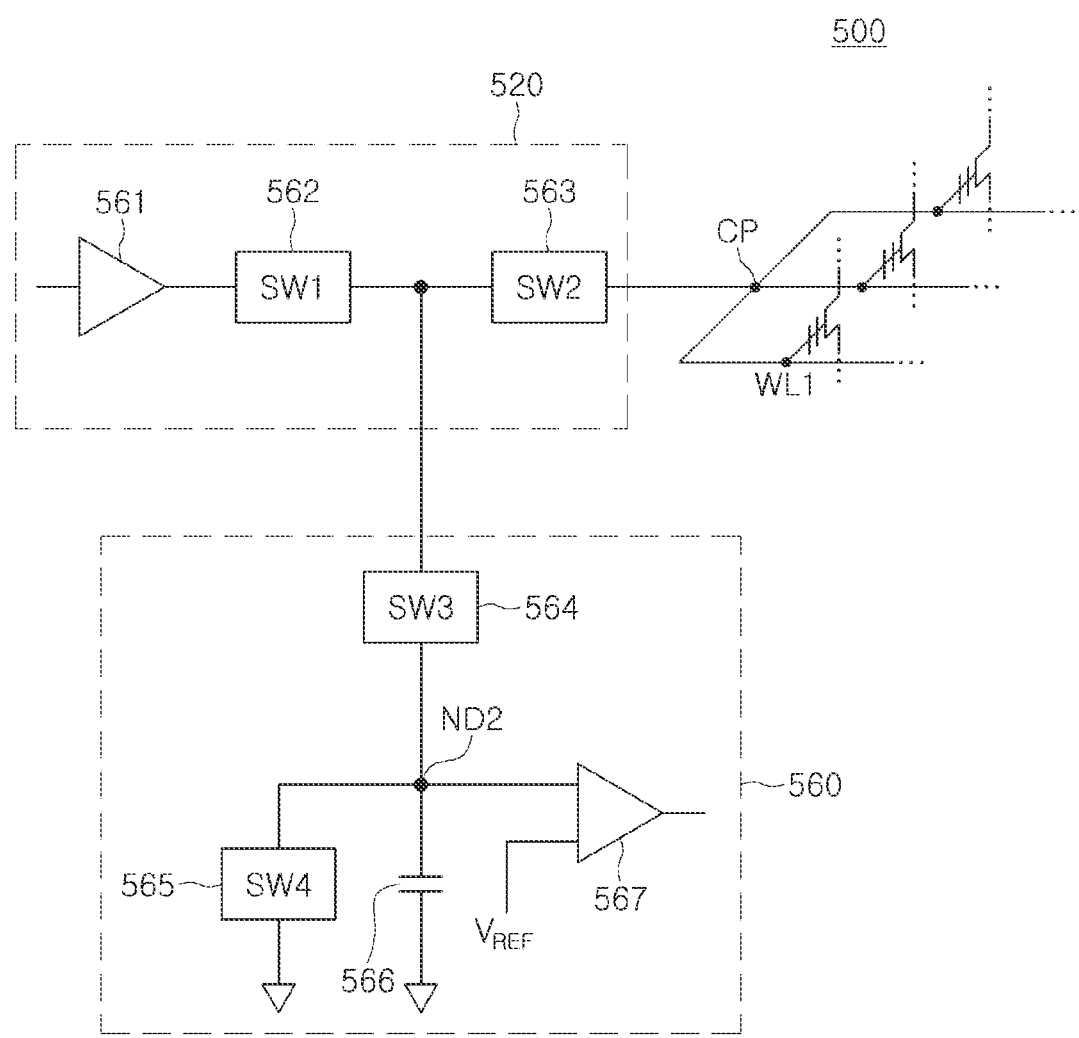
FIG. 11 is a block diagram illustrating a memory device according to embodiments of the inventive concept.

FIG. 11 is a block diagram illustrating a memory device according to embodiments of the inventive concept and is presented by way of comparison with FIG. 5.

Some components of the test unit (360 in FIG. 5) may be included in the row decoder (320 in FIG. 5). Referring to FIG. 11, the row decoder 520 may include a voltage driver 561, a first switch 562, and a second switch 563. An output of the voltage driver 561 may be connected to a first end of the first switch 562, and a first end of the first word line WL1 may be connected to a first end of the second switch 563. A second end of the first switch 562 and a second end of the second switch 563 may be commonly connected. The row decoder 520 may supply a low voltage from the voltage driver 561 to the first word line WL1 by turning ON the first switch 562 and the second switch 563. Electrical charge may be provided to the word line capacitor and the parasitic capacitor by a low voltage provided by the voltage driver 561.

A test unit 560 included in a control logic may include a third switch 564, a fourth switch 565, a sensing capacitor 566, and a comparator 567. A first end of the third switch 564 may be connected to a row decoder 520, and a second end of the third switch 564 may be connected to the sensing node ND2. The fourth switch 565 and the sensing capacitor 566 may be connected in parallel to each other and may be commonly connected to the sensing node ND2. The test unit 560 may initialize the sensing node ND2 by turning ON the fourth switch 565.

The row decoder 520 may turn OFF the first switch 562 and turn ON the second switch 563. The test unit 560 may turn OFF the fourth switch 565 and turn ON the third switch 564. Accordingly, the memory device 500 may perform the charge sharing operation between the word line capacitor and the parasitic capacitor to the sensing capacitor 566.

As described above, a time constant of the voltage of the sensing node ND2 may be determined by resistance of the cell contact plug CP and the word line capacitor. When resistance of the cell contact plug CP is small, the voltage of the sensing node ND2 increases relatively sharply, and when resistance of the cell contact plug CP is large, the voltage of the sensing node ND2 may increase relatively gradually.

After the charge sharing operation is completed following a predetermined period of time, the third switch 564 may be turned OFF. After the third switch 564 is turned OFF, the comparator 567 may receive the voltage of the sensing node ND2 and the reference voltage $V_{REF}$. The comparator 567 may compare the voltage of the sensing node ND2 with the reference voltage $V_{REF}$ at a time during a first time period. If the voltage of the sensing node ND2 is greater than the reference voltage $V_{REF}$ as a result of the comparison, it may be determined that line resistance of the word line is small. Conversely, if the voltage of the second node ND2 is less than the reference voltage $V_{REF}$ as a result of the comparison, it may be determined that line resistance of the word line is large.

That is, the memory device 500 may accurately measure line resistance of the word line by measuring the voltage of the sensing capacitor 566. Accordingly, reliability of data may be guaranteed by initially detecting (or screening for) resistive defects in the memory device 500.

After the word line is precharged, leakage current may occur in the word line capacitor over time. Accordingly, when the third switch 464 is turned ON again, the voltage of the sensing node ND2 may decrease. When the amount of leakage current occurring in the word line capacitor is large, the voltage of the sensing node ND2 may decrease relatively sharply, and when the amount of leakage current occurring in the word line capacitor is small, the voltage of the sensing node ND2 may decrease relatively gradually.

The comparator 567 may receive the voltage of the sensing node ND2 and the reference voltage $V_{REF}$. The comparator 567 may compare the voltage of the sensing node ND2 and the reference voltage $V_{REF}$ at a time during a second time period following the first time period. If the voltage of the sensing node ND2 is greater than the reference voltage $V_{REF}$ as a result of the comparison, it may be determined that the amount of leakage current occurring in the word line capacitor is small. Conversely, if the voltage of the sensing node ND2 is less than the reference voltage $V_{REF}$ as a result of the comparison, it may be determined that the amount of leakage current occurring in the word line capacitor is large.

That is, the memory device 500 may measure line resistance of the word line and a leakage current of the word line capacitor in order to test whether the word line is defective. These test operations may be performed at a wafer level and/or at a chip level. For example, in order to use a solution product stably, these test operations may be used as a defense code that processes the corresponding memory block as a bad block, when a word line defect is detected.

Therefore, reliability of data may be guaranteed and quality competitiveness may be secured.

Figure 12:
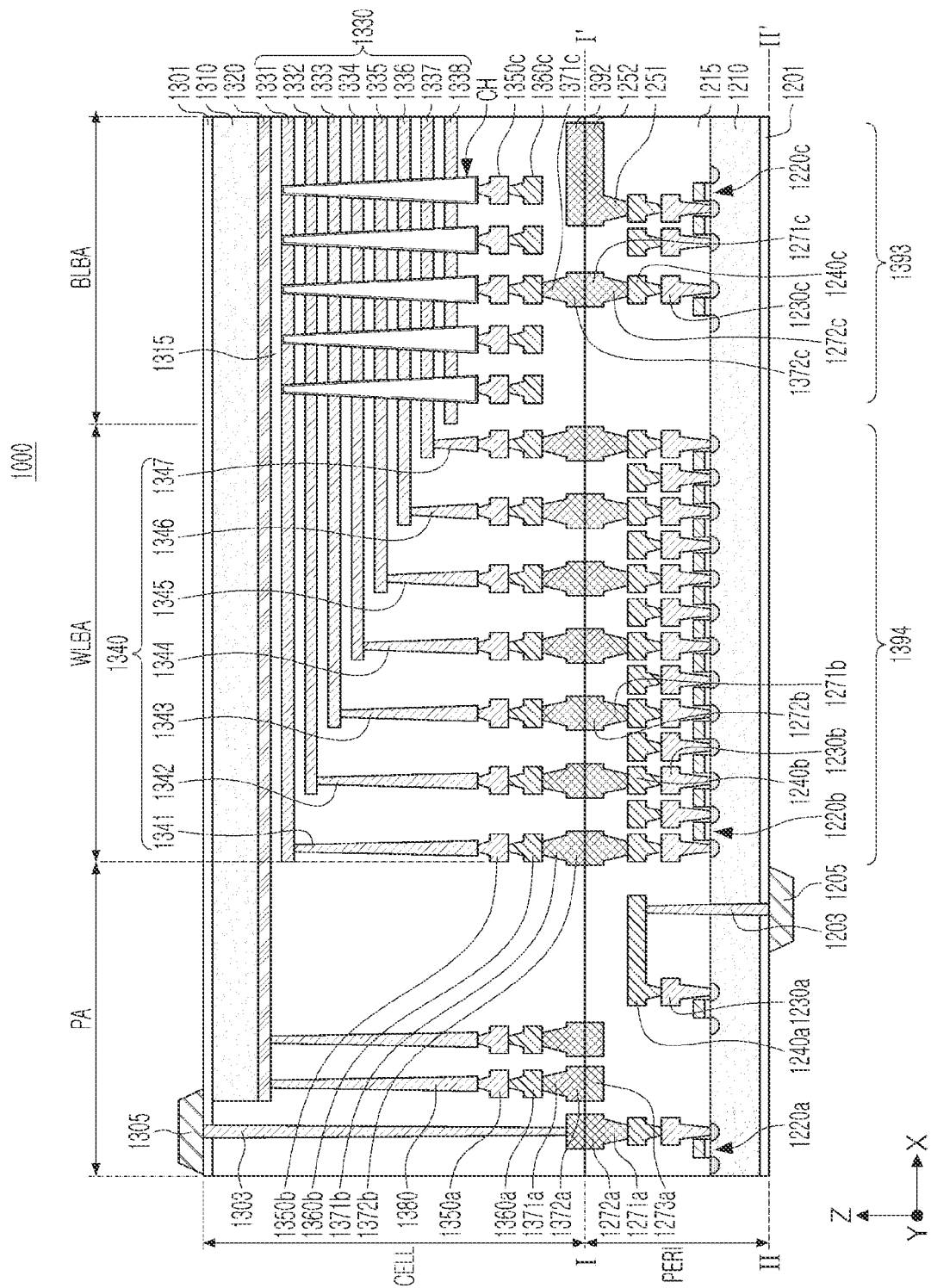
FIG. 12 is a cross-sectional diagram of a memory device according to embodiments of the inventive concept.

FIG. 12 is a cross-sectional diagram illustrating a memory device 1000 according to embodiments of the inventive concept.

Referring to FIG. 12, the memory device 1000 may have a chip to chip (C2C) structure. The C2C structure may refer to a structure in which an upper chip including a cell area CELL is fabricated on a first wafer, a lower chip including a peripheral circuit area PERI is fabricated on a second wafer different from the first wafer, and the upper chip and the lower chip are connected to each other by a bonding method. For example, the bonding method may refer to a method of electrically connecting a bonding metal formed on an uppermost metal layer of the upper chip and a bonding metal formed on an uppermost metal layer of the lower chip. For example, when the bonding metal is formed of copper (Cu), the bonding method may be a Cu—Cu bonding method, and the bonding metal may also be formed of aluminum (Al) or tungsten (W).

Each of the peripheral circuit area PERI and the cell area CELL of the memory device 1000 may include an external pad bonding area PA, a word line bonding area WLBA, and a bit line bonding area BLBA.

The peripheral circuit area PERI may include a first substrate 1210, an interlayer insulating layer 1215, circuit elements 1220a, 1220b, and 1220c formed on the first substrate 1210, first metal layers 1230a, 1230b, and 1230c connected to the circuit elements 1220a, 1220b, and 1220c, respectively, and second metal layers 1240a, 1240b, and 1240c formed on the first metal layers 1230a, 1230b, and 1230c. In an embodiment, the first metal layers 1230a, 1230b, and 1230c may be formed of tungsten having a relatively high electrical resistivity, and the second metal layers 1240a, 1240b, and 1240c may be formed of copper having a relatively low electrical resistivity.

In the present disclosure, only the first metal layers 1230a, 1230b, and 1230c and the second metal layers 1240a, 1240b, and 1240c are illustrated and described, but are not limited thereto, and at least one metal layer may be further formed on the second metal layers 1240a, 1240b, and 1240c. At least some of the one or more metal layers formed on the second metal layers 1240a, 1240b, and 1240c are formed of aluminum having a lower electrical resistivity than copper forming the second metal layers 1240a, 1240b, and 1240c.

An interlayer insulating layer 1215 may be disposed on the first substrate 1210 and include an insulating material such as silicon oxide or silicon nitride to cover circuit elements 1220a, 1220b, and 1220c, first metal layers 1230a, 1230b, and 1230c, and second metal layers 1240a, 1240b, and 1240c.

Lower bonding metals 1271b and 1272b may be formed on the second metal layer 1240b of the word line bonding area WLBA. In the word line bonding area WLBA, the lower bonding metals 1271b and 1272b of the peripheral circuit area PERI may be electrically connected to upper bonding metals 1371b and 1372b of the cell area CELL by a bonding method, and the lower bonding metals 1271b and 1272b and the upper bonding metals 1371b and 1372b may be formed of aluminum, copper, or tungsten.

The cell area CELL may provide at least one memory block. The cell area CELL may include a second substrate 1310 and a common source line 1320. On the second substrate 1310, word lines 1331 to 1338; 1330 may be vertically stacked. String selection lines and ground selection lines may be disposed above and below the word lines 1330, respectively, and word lines 1330 may be disposed between the string selection lines and the ground selection line.

In the bit line bonding area BLBA, a channel structure CH may vertically extend to penetrate the word lines 1330, the string selection lines, and the ground selection line. The channel structure CH may include a data storage layer, a channel layer, and an embedded insulating layer, and the channel layer may be electrically connected to the first metal layer 1350c and the second metal layer 1360c. For example, the first metal layer 1350c may be a bit line contact, and the second metal layer 1360c may be a bit line. In some embodiments, the bit line 1360c may extend in the first horizontal direction.

As shown in FIG. 12, an area in which the channel structure CH and the bit line 1360c are disposed may be defined as the bit line bonding area BLBA. In the bit line bonding area BLBA, the bit line 1360c may be electrically connected to the circuit elements 1220c providing a page buffer 1393 in the peripheral circuit area PERI. For example, the bit line 1360c may be connected to the upper bonding metals 1371c and 1372c in the peripheral circuit area PERI, and the upper bonding metals 1371c and 1372c may be connected to the lower bonding metals 1271c and 1272c connected to the circuit elements 1220c of the page buffer 1393.

In the word line bonding area WLBA, the word lines 1330 may extend in the second horizontal direction (e.g., a X-axis direction) perpendicular to the first direction and parallel to the upper surface of the second substrate 1310, and may be connected to cell contact plugs 1341 to 1347; 1340. The word lines 1330 and the cell contact plugs 1340 may be connected to each other in pads provided as at least some of the word lines 1330 extend in different lengths in the second horizontal direction (e.g., a Y-direction). A first metal layer 1350b and a second metal layer 1360b may be sequentially connected to upper portions of the cell contact plugs 1340 connected to the word lines 1330. The cell contact plugs 1340 may be connected to the peripheral circuit area PERI through the upper bonding metals 1371b and 1372b of the cell area CELL and the lower bonding metals 1271b and 1272b of the peripheral circuit area PERI in the word line bonding area WLBA.

The cell contact plugs 1340 may be electrically connected to the circuit elements 1220b forming the row decoder 1394 in the peripheral circuit area PERI. In an embodiment, an operating voltage of the circuit elements 1220b forming the row decoder 1394 may be different from an operating voltage of the circuit elements 1220c forming the page buffer 1393. For example, the operating voltage of the circuit elements 1220c forming the page buffer 1393 may be greater than the operating voltage of the circuit elements 1220b forming the row decoder 1394.

A common source line contact plug 1380 may be disposed in the external pad bonding area PA. The common source line contact plug 1380 may be formed of a conductive material such as a metal, a metal compound, or polysilicon and may be electrically connected to the common source line 1320. A first metal layer 1350a and a second metal layer 1360a may be sequentially stacked on the common source line contact plug 1380. For example, an area in which the common source line contact plug 1380, the first metal layer 1350a, and the second metal layer 1360a are disposed may be defined as the external pad bonding area PA.

Meanwhile, input/output (I/O) pads 1205 and 1305 may be disposed in the external pad bonding area PA. Referring to FIG. 12, a lower insulating layer 1201 covering a lower surface of the first substrate 1210 may be formed under the first substrate 1210, and the first I/O pad 1205 may be formed on the lower insulating layer 1201. The first I/O pad

1205 may be connected to at least one of the circuit elements 1220*a*, 1220*b*, and 1220*c* disposed in the peripheral circuit area PERI through the first I/O contact plug 1203 and may be separated from the first substrate 1210 by the lower insulating layer 1201. In addition, a side insulating layer may be disposed between the first I/O contact plug 1203 and the first substrate 1210 to electrically separate the first I/O contact plug 1203 from the first substrate 1210.

Referring to FIG. 12, an upper insulating layer 1301 covering an upper surface of the second substrate 1310 may be formed on the second substrate 1310, and a second I/O pad 1305 may be disposed on the upper insulating layer 1301. The second I/O pad 1305 may be connected to at least one of the circuit elements 1220*a*, 1220*b*, and 1220*c* disposed in the peripheral circuit area PERI through the second I/O contact plug 1303. In an embodiment, the second I/O pad 1305 may be electrically connected to the circuit element 1220*a*.

In some embodiments, the second substrate 1310 and the common source line 1320 may not be disposed in an area in which the second I/O contact plug 1303 is disposed. Also, the second I/O pad 1305 may not overlap the word lines 1330 in the vertical direction. Referring to FIG. 12, the second I/O contact plug 1303 may be horizontally separated from the second substrate 1310 in a direction parallel to the upper surface of the second substrate 1310, and may be connected to the second I/O pad 1305 through an interlayer insulating layer 1315 of the cell area CELL.

In some embodiments, the first I/O pad 1205 and the second I/O pad 1305 may be selectively formed. As an example, the memory device 1000 includes only the first I/O pad 1205 disposed on the lower insulating layer 1201 or only the second I/O pad 1305 disposed on the upper insulating layer 1301. Alternately, the memory device 1000 may include both the first I/O pad 1205 and the second I/O pad 1305.

In each of the external pad bonding area PA and the bit line bonding area BLBA included in each of the cell area CELL and the peripheral circuit area PERI, the metal pattern of the uppermost metal layer may be a dummy pattern, or the uppermost metal layer may be empty.

In the memory device 1000 of FIG. 12, in the external pad bonding area PA, a lower metal pattern 1273*a* having the same shape as the upper metal pattern 1372*a* of the cell area CELL may be formed on the uppermost metal layer of the peripheral circuit area PERI to correspond to the upper metal pattern 1372*a* formed on the uppermost metal layer of the cell area CELL. The lower metal pattern 1273*a* formed on the uppermost metal layer of the peripheral circuit area PERI may not be connected to a separate contact in the peripheral circuit area PERI. Similarly, to correspond to the lower metal pattern 273*a* formed on the uppermost metal layer of the peripheral circuit area PERI in the external pad bonding area PA, an upper metal pattern 273*a* having the same shape as the lower metal pattern 273*a* of the peripheral circuit area PERI may be formed on the upper metal layer of the cell area CELL.

Lower bonding metals 1271*b* and 1272*b* may be formed on the second metal layer 1240*b* of the word line bonding region WLBA. In the word line bonding area WLBA, the lower bonding metals 1271*b* and 1272*b* of the peripheral circuit area PERI may be electrically connected to the upper bonding metals 1371*b* and 1372*b* of the cell area CELL by a bonding method.

In addition, in the bit line bonding area BLBA, to correspond to a lower metal pattern 1252 formed on the uppermost meat layer of the peripheral circuit area PERI, an upper metal pattern 1392 having the same shape as the lower metal pattern 1252 of the peripheral circuit area PERIO may be formed on the uppermost metal layer of the cell area CELL. A contact may not be formed on the upper metal pattern 1392 formed on the uppermost metal layer of the cell area CELL.

According to an embodiment of the inventive concept, a resistive defect may be initially detected by accurately measuring line resistance of an open node having a capacitor ingredient in the memory device. Therefore, reliability of data may be guaranteed and quality competitiveness may be ensured.

While certain embodiments of the inventive concept have been shown and described above, it will be apparent to those skilled in the art that modifications and variations could be made without departing from the scope of the inventive concept as defined by the appended claims.

What is claimed is:

1. A memory device comprising:
   a memory cell array including memory cells respectively arranged in regions wherein word lines and bit lines intersect;
   a row decoder configured to select a word line as a selected word line from among the word lines in response to a received address; and
   control logic including a sensing capacitor having a size proportional to a size of a word line capacitor associated with the selected word line,
   wherein the control logic is configured to measure a line resistance of the selected word line by precharging the selected word line, performing a charge sharing operation between the selected word line and the sensing capacitor following the precharging of the selected word line, and measuring a voltage of the sensing capacitor following the performing of the charge sharing operation.

2. The memory device of claim 1, wherein the line resistance of the selected word line is a resistance in a path between the selected word line and the row decoder.

3. The memory device of claim 1, wherein the control logic further includes a first switch initializing the sensing capacitor, and a second switch connecting the selected word line to the sensing capacitor.

4. The memory device of claim 3, wherein the control logic further includes a comparator configured to receive a sense voltage from the sensing capacitor, receive a reference voltage, compare the sense voltage and the reference voltage, and provide a comparison result based on the comparing of the sense voltage and the reference voltage, and
   the control logic measures the voltage of the sensing capacitor following the performing of the charge sharing operation with reference to the comparison result.

5. The memory device of claim 3, wherein the control logic further includes a voltage driver providing a charge voltage, and a third switch connecting the selected word line to the voltage driver.

6. The memory device of claim 5, wherein
   upon connecting the selected word line to the voltage driver, the charge voltage is provided to the selected word line to provide an electrical charge to the word line capacitor, and
   upon connecting the selected word line to the sensing capacitor, the electrical charge provided to the word line capacitor is shared with the sensing capacitor.

7. The memory device of claim 6, wherein the word line capacitor is a capacitor existing between the selected word line and word lines adjacent to the selected word line among the word lines.

8. The memory device of claim 3, wherein the row decoder includes a voltage driver providing a charge voltage, and a third switch connecting the selected word line to the voltage driver.

9. The memory device of claim 8, wherein
upon connecting the selected word line to the voltage driver, the charge voltage is provided to the selected word line to provide an electrical charge to the word line capacitor, and
upon connecting the selected word line to the sensing capacitor, the electrical charge provided to the word line capacitor is shared with the sensing capacitor.

10. The memory device of claim 9, wherein the word line capacitor is a capacitor existing between the selected word line and word lines adjacent to the selected word line among the word lines.

11. A memory device comprising:
a memory cell array including memory cells respectively arranged in regions wherein word lines and bit lines intersect;
a row decoder configured to select one word line as a selected word line from among the word lines in response to a received address; and
control logic configured to measure a line resistance of the selected word line, wherein the control logic includes:
a sensing capacitor;
a voltage driver providing a charge voltage;
a first switch having a first end connected to the voltage driver and a second end;
a second switch having a first end connected to the selected word line and a second end connected to the second end of the first switch;
a third switch having a first end connected between the first switch and the second switch and a second end;
a fourth switch connected in parallel with the sensing capacitor and connected to the second end of the third switch; and
a comparator including a first input terminal receiving a sense voltage from the sensing capacitor and a second input terminal receiving a reference voltage.

12. The memory device of claim 11, wherein the control logic turns ON the first switch and the second switch during a precharge period to provide the charge voltage to the selected word line from the voltage driver.

13. The memory device of claim 12, wherein the control logic turns ON the fourth switch during the precharge period to initialize the sensing capacitor.

14. The memory device of claim 12, wherein the control logic turns OFF the first switch and the fourth switch, and turns ON the third switch during a sensing period following the precharge period to perform a charge sharing operation between the selected word line and the sensing capacitor.

15. The memory device of claim 14, wherein following the charge sharing operation, the comparator compares the sense voltage with the reference voltage to generate a comparison result, and
the control logic measures the line resistance of the selected word line with reference to the comparison result.

16. A memory device comprising:
a memory cell array including memory cells respectively arranged in regions wherein word lines and bit lines intersect;
a row decoder configured to select a word line as a selected word line from among the word lines in response to a received address; and
control logic including a data access unit configured to perform at least one data access operation in relation to a memory cell connected to the selected word line, and a test unit including a sensing capacitor,
wherein the test unit is configured to measure a line resistance of the selected word line and measure a leakage current associated with the selected word line by
performing a charge sharing operation between the selected word line and the sensing capacitor,
measuring a voltage of the sensing capacitor during a first time period following the performing of the charge sharing operation to measure the line resistance of the selected word line, and
measuring the voltage of the sensing capacitor during a second time period following the first time period to measure the leakage current associated with the selected word line.

17. The memory device of claim 16, wherein a size of the sensing capacitor is proportional to a size of a word line capacitor associated with the selected word line.

18. The memory device of claim 16, wherein the test unit includes a switch connected in parallel with the sensing capacitor and commonly connected to a sensing node with the sensing capacitor.

19. The memory device of claim 18, wherein the test unit further includes a comparator including a first input terminal connected to the sensing node and receiving a sense voltage from the sensing capacitor, and a second input terminal receiving a reference voltage,
the comparator configured to compare the sense voltage with the reference voltage during the first time period to measure the line resistance of the selected word line, and further configured to compare the sense voltage with the reference voltage during the second time period to measure the leakage current of the selected word line.

20. The memory device of claim 19, wherein the control logic includes a voltage driver applying a charge voltage to the selected word line to precharge the selected word line with an electrical charge, and thereafter,
the charge sharing operation shares the electrical charge between the selected word line and the sensing capacitor.

* * * * *